(12) United States Patent
Kumakura et al.

(10) Patent No.: US 10,749,400 B2
(45) Date of Patent: Aug. 18, 2020

(54) BUS BAR UNIT

(71) Applicants: Nissan Motor Co., Ltd., Yokohama-shi, Kanagawa (JP); Tokai Kogyo Co.,Ltd., Obu-shi, Aichi (JP)

(72) Inventors: Susumu Kumakura, Kanagawa (JP); Yusuke Horino, Aichi (JP); Yosuke Ota, Aichi (JP)

(73) Assignees: Nissan Motor Co., Ltd., Yokohama (JP); Tokai Kogyo Co., Ltd., Obu (JP)

( * ) Notice: Subject to any disclaimer, the term of this patent is extended or adjusted under 35 U.S.C. 154(b) by 85 days.

(21) Appl. No.: 16/323,613

(22) PCT Filed: Jul. 19, 2017

(86) PCT No.: PCT/JP2017/026057
§ 371 (c)(1),
(2) Date: Feb. 6, 2019

(87) PCT Pub. No.: WO2018/042919
PCT Pub. Date: Mar. 8, 2018

(65) Prior Publication Data
US 2019/0165635 A1    May 30, 2019

(30) Foreign Application Priority Data

Aug. 30, 2016 (JP) .................................. 2016-167632

(51) Int. Cl.
| | |
|---|---|
| *H02K 3/50* | (2006.01) |
| *H02K 5/04* | (2006.01) |
| *H02K 11/33* | (2016.01) |
| *H02K 3/38* | (2006.01) |
| *H02M 7/00* | (2006.01) |

(Continued)

(52) U.S. Cl.
CPC ............... *H02K 3/50* (2013.01); *H02K 3/28* (2013.01); *H02K 3/38* (2013.01); *H02K 5/04* (2013.01); *H02K 11/33* (2016.01); *H02M 5/4585* (2013.01); *H02M 7/003* (2013.01); *H05G 1/00* (2013.01); *H05K 1/00* (2013.01);
(Continued)

(58) Field of Classification Search
CPC ............ H02K 3/50; H02K 11/33; H02K 5/04
USPC .................... 310/68 R, 71, 214, 239, 249
See application file for complete search history.

(56) References Cited

U.S. PATENT DOCUMENTS 6,369,473 B1 * 4/2002 Baumeister ............ H02K 3/522
310/71
6,930,418 B2 * 8/2005 Kobayashi ............. H02K 3/522
310/214

(Continued)

FOREIGN PATENT DOCUMENTS

JP         2010-63273 A       3/2010

*Primary Examiner* — Jose A Gonzalez Quinones
(74) *Attorney, Agent, or Firm* — Global IP Counselors, LLP

(57) ABSTRACT

A bus bar unit is provided with a plurality of bus bars and an insulating holder. The insulating holder holds the bus bars in a parallel arrangement and insulates between the bus bars. The insulating holder includes a molded portion, a wall portion and a groove portion. The molded portion covers an entire periphery of at least one bus bar from among the plurality of bus bars. The wall portion is provided at a position spaced apart from a side surface of the molded portion to insulate the bus bars. The groove portion holds a remaining bus bar between the molded portion and the wall portion.

10 Claims, 12 Drawing Sheets

(51) Int. Cl.
    *H05G 1/00*          (2006.01)
    *H05K 1/00*          (2006.01)
    *H02M 5/458*        (2006.01)
    *H02K 3/28*          (2006.01)
    *H02K 3/52*          (2006.01)

(52) U.S. Cl.
    CPC ............ *H02K 3/52* (2013.01); *H02K 2203/09* (2013.01); *Y02T 10/641* (2013.01)

(56) References Cited

U.S. PATENT DOCUMENTS

| | | | | |
|---|---|---|---|---|
| 7,193,345 | B2 * | 3/2007 | Shinzaki | H02K 3/522 |
| | | | | 310/179 |
| 7,514,828 | B2 * | 4/2009 | Vollmuth | H02K 3/38 |
| | | | | 310/71 |
| 7,943,072 | B2 * | 5/2011 | Maegawa | H01R 43/24 |
| | | | | 264/250 |
| 8,878,407 | B2 * | 11/2014 | Ikura | H02K 3/522 |
| | | | | 29/598 |
| 9,742,234 | B2 * | 8/2017 | Hashimoto | H02K 3/50 |
| 9,871,422 | B2 * | 1/2018 | Kim | H02K 3/522 |
| 2010/0156208 | A1 * | 6/2010 | Schaflein | H02K 3/522 |
| | | | | 310/71 |

\* cited by examiner

BUS BAR UNIT

CROSS-REFERENCE TO RELATED APPLICATIONS

This application is a U.S. national stage application of International Application No. PCT/JP2017/026057, filed on Jul. 19, 2017. This application claims priority to Japanese Patent Application No. 2016-167632 filed on Aug. 30, 2016. The entire disclosure of Japanese Patent Application No. 2016-167632 is entirely incorporated herein by reference.

BACKGROUND

Technical Field

The present invention relates to a bus bar unit provided with an insulating holder for insulating between a plurality of bus bars.

Background Information

Conventionally, insulating holders that electrically insulate between a plurality of bus bars in a stator are known. These insulating holders have partition wall portions between the bus bars, and have holding grooves for holding the bus bars between the partition wall portions. The bus bars are inserted into these holding grooves. The height of the partition wall portions is set higher than the height defined by the width of the vertically positioned bus bars in order to ensure a creepage distance and to ensure an insulation performance, and the bus bars are accommodated inside the holding grooves. Moreover, in a conventional stator, it is possible to miniaturize a motor by employing the configuration described above. One example of a conventional stator is disclosed in Japanese Laid Open Patent Application No. 2010-063273.

SUMMARY

However, in the conventional stator, in order to ensure the creepage distance, the height of the partition wall portions must be made higher than the height defined by the width of the bus bars. Moreover, in order to miniaturize the motor, the width of the partition wall portions cannot be increased. Consequently, if an external force is applied to the partition wall portion, there is the risk that the partition wall portion will be damaged, and there is a problem in that there is room for improvement in durability and reliability.

In view of the problems described above, an object of the present invention is to provide a bus bar unit that can improve the durability and reliability of the insulating holder while ensuring the insulation performance.

In order to achieve the object described above, the bus bar unit of the present invention comprises a plurality of bus bars, and an insulating holder that holds the plurality of bus bars in a parallel arrangement and insulates between the plurality of bus bars.

In this bus bar unit, the insulating holder includes a molded portion molded around an entire periphery of at least one bus bar from among the plurality of bus bars, a wall portion that is provided at a position spaced apart from a side surface of the molded portion and that insulates between the plurality of bus bars, and a groove portion that holds a remaining bus bar between the molded portion and the wall portion. A height of the wall portion is set lower than a height defined by a width of the bus bars.

In this manner, by including a molded portion as well as setting the height of the wall portion lower than the height defined by the bus bar, it is possible to improve the durability and reliability of the insulating holder while ensuring the insulation performance.

DETAILED DESCRIPTION OF THE EMBODIMENTS

Figure 1:
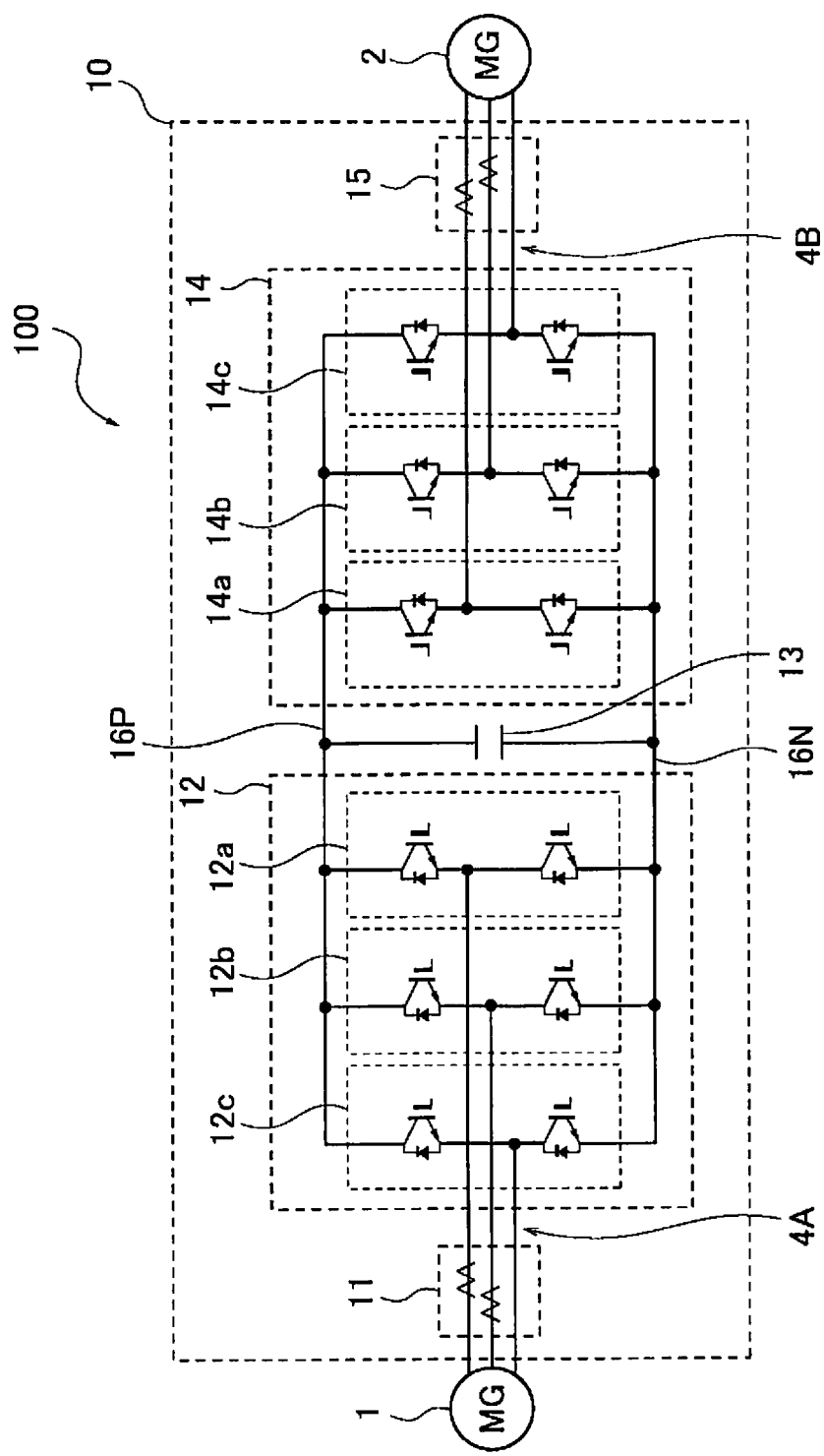
FIG. 1 is a circuit diagram illustrating a drive system of a range extender electric vehicle to which a bus bar unit according to the first embodiment is applied.

Preferred embodiments for realizing a bus bar unit according to the present invention will be described below with reference to selected embodiments illustrated in the drawings.

First Embodiment

The configuration will be described first. The bus bar unit according to the first embodiment is applied to a bus bar unit of an inverter device (one example of a power conversion device) of a motor/generator that is mounted on a range extender electric vehicle (one example of an electrically driven vehicle) as a travel drive source, or the like. The range extender electric vehicle (EV) has two motor/generators and an engine dedicated to power generation. This range extender electric vehicle uses one of the two motor/generators for traveling and the other one for power generation. Power generation is carried out by the power generation motor/generator using the engine as the power source. The configuration of the first embodiment will be described separately with respect to the "circuit configuration of the drive system," the "configuration of the inverter device," the "detailed configuration of the bus bar module," and the "detailed configuration of the drive side bus bar unit."

Circuit Configuration of the Drive System

FIG. 1 illustrates a circuit diagram showing a drive system of a range extender electric vehicle to which a bus bar unit according to the first embodiment is applied. The circuit configuration of the drive system according to the first embodiment will be described below, with reference to FIG. 1.

The drive system 100 comprises a power generation motor/generator 1, a drive motor/generator 2, and an inverter device 10. The power generation motor/generator 1 generates power using an engine as a power source. The generated electric power is supplied to a high voltage drive battery (not shown, hereinafter also referred to as "battery") of the vehicle, via the inverter device 10. The drive motor/generator 2 is connected to an axle of the vehicle and is driven by electric power supplied from the inverter device 10. The inverter device 10 converts an AC power generated by the power generation motor/generator 1 into a DC power and outputs the converted electric power to the battery. In addition, the inverter device 10 converts the DC power supplied from the battery into the AC power, and outputs the converted electric power to the drive motor/generator 2.

The inverter device 10 comprises a power generation side current sensor 11, a power generation side inverter circuit 12, a smoothing capacitor 13, a drive side inverter circuit 14, a drive side current sensor 15, a PN DC power supply bus 16, a power generation side three-phase wiring 4A, a drive side three-phase wiring 4B, and the like.

The power generation side current sensor 11 is connected between the power generation motor/generator 1 and the power generation side inverter circuit 12. The power generation side current sensor 11 is provided for each of a U-phase wiring included in the power generation side three-phase wiring 4A and a V-phase wiring included in the power generation side three-phase wiring 4A. The power generation side current sensor 11 detects the U and V phase currents of the power generation motor/generator 1, and outputs the detected currents to a controller (not shown). The current of the W-phase can be detected by means of calculation using the detected currents of the U-phase and the V-phase.

The power generation side inverter circuit 12 converts the AC power output from the power generation motor/generator 1 into DC power. The power generation motor/generator 1 is electrically connected to the AC side of the power generation side inverter circuit 12. The smoothing capacitor 13 is connected to the DC side of the power generation side inverter circuit 12. The power generation side inverter circuit 12 comprises a plurality of switching elements and a plurality of diodes. Transistors such as IGBT or MOSFET are used as the switching elements. The diodes are reflux diodes. The switching elements and the diodes are connected in parallel, with the conduction directions of the currents oriented opposite of each other. A circuit in which a plurality of the parallel circuits of the switching elements and the diodes are connected in series becomes an arm circuit of each of the U, V, and W phases. The plurality of arm circuits are connected in parallel between the PN DC power supply buses 16. The U, V, and W phase arm circuits are respectively modularized as power generation side semiconductor modules 12a (U-phase), 12b (V-phase) and 12c (W-phase). The electric power that is output from the DC side of the power generation side inverter circuit 12 is supplied to the battery via the smoothing capacitor 13, to thereby charge the battery. For example, when the power generation motor/generator 1 operates as a starter motor for starting the engine (not shown), the power generation side inverter circuit 12 converts the DC power from the battery into the AC power, which is supplied to the power generation motor/generator 1 to drive the power generation motor/generator 1.

The smoothing capacitor 13 smooths the output voltage of the DC side of the power generation side inverter circuit 12. The smoothing capacitor 13 smooths the input voltage of the DC side of the drive side inverter circuit 14. This smoothing capacitor 13 is connected between a DC side terminal of the power generation side inverter circuit 12 and a DC side terminal of the drive side inverter circuit 14. The smoothing capacitor 13 is connected between the PN DC power supply buses 16.

The drive side inverter circuit 14 converts the DC power that is output from the battery into the AC power. The drive motor/generator 2 is electrically connected to the AC side of the drive side inverter circuit 14. The smoothing capacitor 13 is connected to the DC side of the drive side inverter circuit 14. The drive side inverter circuit 14 comprises a plurality of switching elements and a plurality of diodes. Transistors such as IGBT or MOSFET are used as the switching elements. The diodes are reflux diodes. The drive side inverter circuit 14 is configured by a bridge circuit similar to the power generation side inverter circuit 12. The arm circuits of each of the U, V, and W phases are connected in parallel between the PN DC power supply buses 16. The U, V, and W phase arm circuits are respectively modularized as drive side semiconductor modules 14a (U-phase), 14b (V-phase) and 14c (W-phase). The drive side inverter circuit 14 converts the regenerative power (AC power) of the drive motor/generator 2 into DC power by means of a regenerative operation of the drive motor/generator 2, which is supplied to the battery, and the battery is charged by the regenerative power of the drive motor/generator 2.

The drive side current sensor 15 is a sensor for detecting input and output currents of the drive motor/generator 2. The drive side current sensor 15 is connected between the drive motor/generator 2 and the drive side inverter circuit 14. The drive side current sensor 15 is provided for each of the U-phase wiring included in the drive side three-phase wiring 4B and a V-phase wiring included in the drive side three-phase wiring 4B. The drive side current sensor 15 detects the U and V phase currents of the drive motor/generator 2, and outputs the detected currents to a controller (not shown). The current of the W-phase can be detected by means of calculation using the detected currents of the U-phase and the V-phase.

The PN DC power supply bus 16 is configured from a bus bar. The PN DC power supply bus 16 is composed of a P DC power supply bus 16P which is a P-pole wiring, and an N DC power supply bus 16N, which is an N-pole wiring.

The power generation side three-phase wiring 4A connects the input terminals of each phase of the power generation side inverter circuit 12 and the output terminals of each phase of the power generation motor/generator 1.

The drive side three-phase wiring 4B connects the output terminals of each phase of the drive side inverter circuit 14 and the input terminals of each phase of the drive motor/generator 2.

Configuration of the Inverter Device

Figure 2:
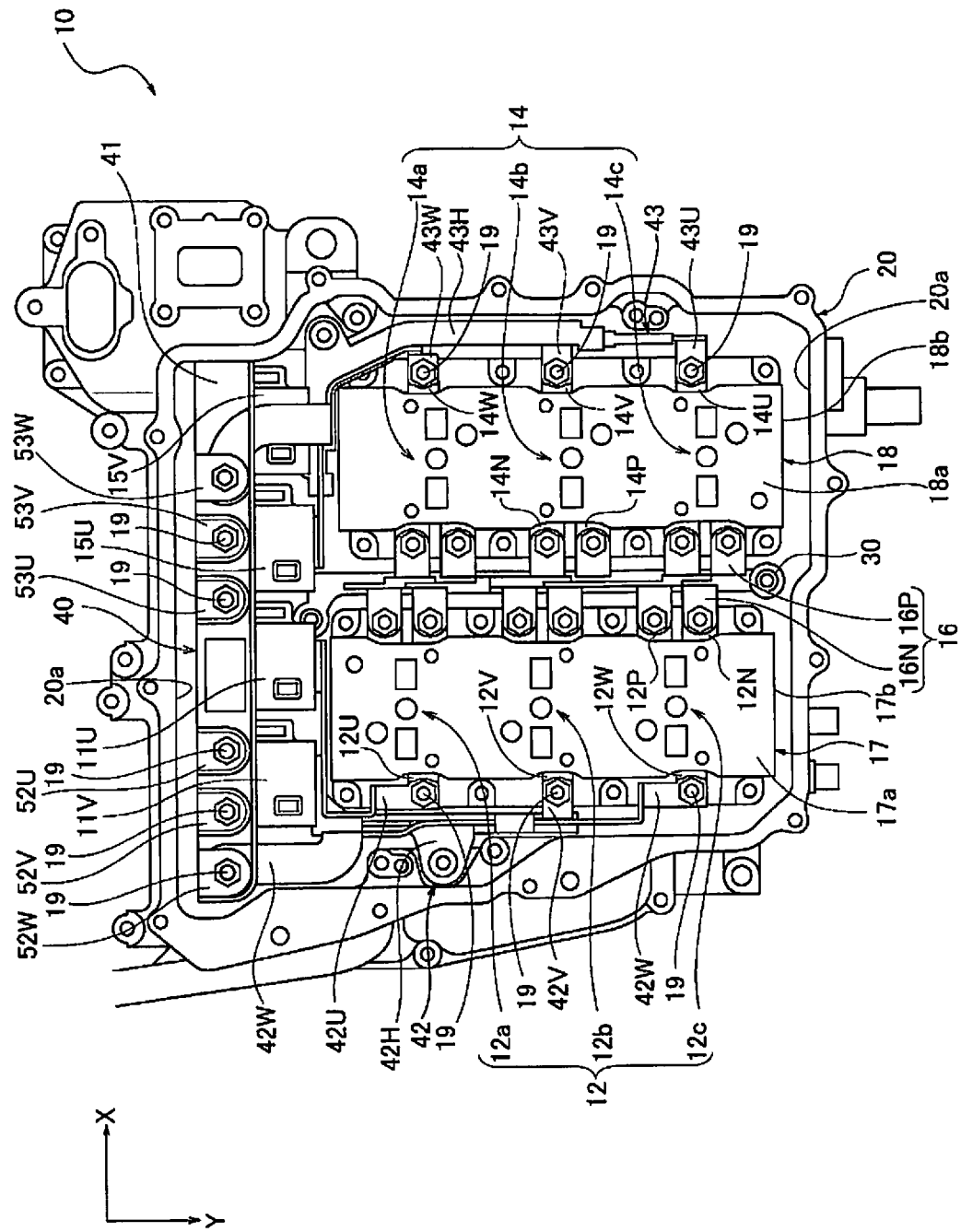
FIG. 2 is a schematic plan view illustrating the inside of an inverter device to which the bus bar unit according to the first embodiment is applied.

FIG. 2 is a schematic plan view of the inside of an inverter device to which the bus bar unit according to the first embodiment is applied. The inverter device according to the first embodiment will be described below with reference to FIG. 2.

The inverter device 10 has a chassis (not shown) for housing the power generation side inverter circuit 12, and the like. The chassis is disposed, for example, in a position above the power generation motor/generator 1 and the drive motor/generator 2. In addition, the chassis has a lid portion (not shown) and a main body portion 20. The inside of this main body portion 20 houses the power generation side current sensor 11, the power generation side inverter circuit 12, the drive side inverter circuit 14, the drive side current sensor 15, the PN DC power supply bus 16, a power generation side substrate 17, a drive side substrate 18, a bus bar structure 30, and a bus bar module 40. A space for housing external connection components, such as the smoothing capacitor 13, is provided on a portion of the bottom surface of the inverter device 10. The inside of the inverter device 10 has a structure in which the external connection components are electrically connected with the bus bar structure 30.

The power generation side inverter circuit 12 is mounted on an upper surface 17a of the power generation side substrate 17. The power generation side semiconductor modules 12a, 12b, 12c are arranged in rows (Y direction) on the upper surface 17a of the power generation side substrate 17.

The drive side inverter circuit 14 is mounted on an upper surface 18a of the drive side substrate 18. The drive side semiconductor modules 14a, 14b, 14c are arranged in rows (Y direction) on the upper surface 18a of the drive side substrate 18. A cooler (not shown) is provided on a lower surface 17b of the power generation side substrate 17 and a lower surface 18b of the drive side substrate 18.

Power generation side DC terminals 12P, 12N (terminals on the DC side of the power generation side inverter circuit 12) of the power generation side semiconductor modules 12a-12c are provided on the bus bar structure 30 side of the power generation side substrate 17. Drive side DC terminals 14P, 14N (terminals on the DC side of the drive side inverter circuit 14) of the drive side semiconductor modules 14a-14c are provided on the bus bar structure 30 side of the drive side substrate 18. The power generation side DC terminals 12P, 12N and drive side DC terminals 14P, 14N are respectively connected to a P bus bar 16P and an N bus bar 16N with bolts 19.

Power generation side AC terminals 12U, 12V, 12W (terminals on the AC side of the power generation side inverter circuit 12) of the power generation side semiconductor modules 12a-12c are provided on the opposite side of the power generation side DC terminals 12P, 12N across the power generation side substrate 17. The U-phase, V-phase, and W-phase power generation side AC terminals 12U, 12V, 12W are fastened with bolts 19 to U-phase, V-phase, and W-phase power generation side bus bars 42U, 42V, 42W, respectively, as described further below. Drive side AC terminals 14U, 14V, 14W (terminals on the AC side of the drive side inverter circuit 14) of the drive side semiconductor modules 14a-14c are provided on the opposite side of the drive side DC terminals 14P, 14N across the drive side substrate 18. The U-phase, V-phase, and W-phase drive side AC terminals 14U, 14V, 14W are fastened with bolts 19 to U-phase, V-phase, and W-phase drive side bus bars 43U, 43V, 43W, respectively, as described further below.

The bus bar structure 30 is disposed between the power generation side substrate 17 and the drive side substrate 18. That is, the bus bar structure 30 becomes the boundary between the power generation side substrate 17 and the drive side substrate 18. The bus bar structure 30 holds the P bus bar 16P, which is the P DC power supply bus 16P, and the N bus bar 16N, which is the N DC power supply bus 16N.

The bus bar module 40 is arranged along an inner wall 20a of the main body portion 20. The bus bar module connects the power generation side semiconductor modules 12a-12c and the power generation motor/generator 1. The bus bar module 40 connects the drive side semiconductor modules 14a-14c and the drive motor/generator 2.

Detailed Configuration of the Bus Bar Module

Figure 3:
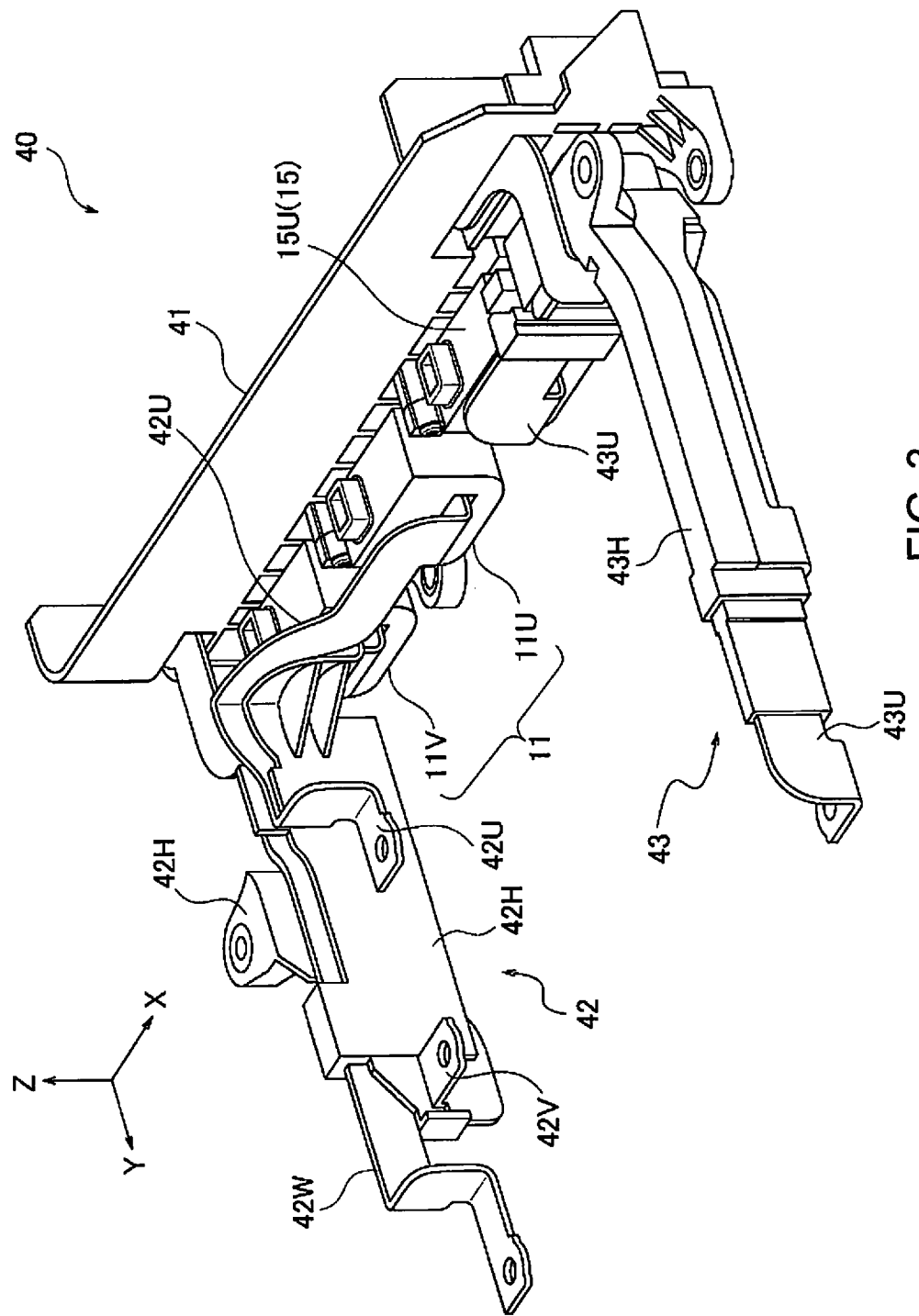
FIG. 3 is a schematic perspective view illustrating a bus bar module to which the bus bar unit according to the first embodiment is applied.
Figure 4:
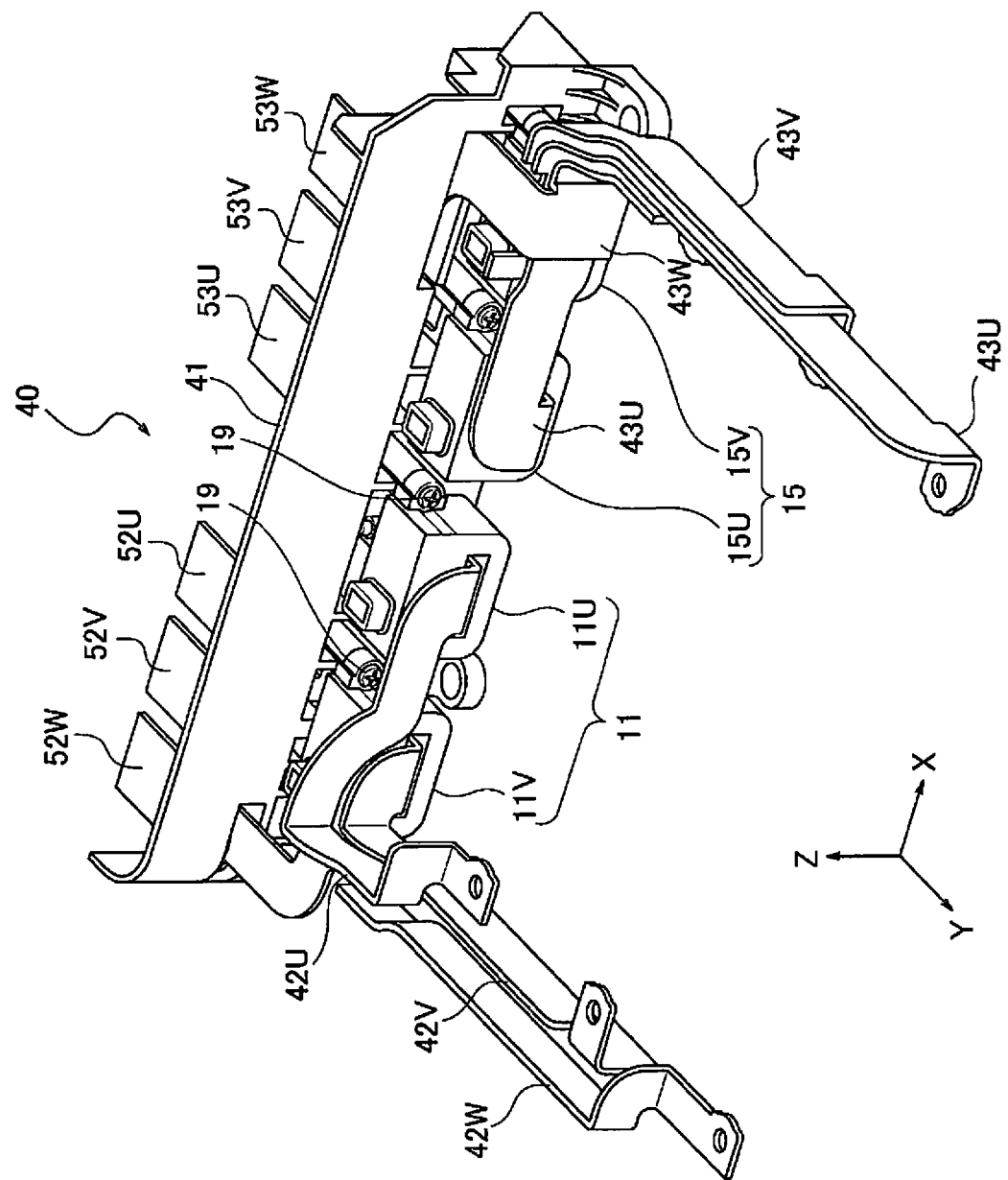
FIG. 4 is a schematic perspective view illustrating the bus bar module to which the bus bar unit according to the first embodiment is applied, and a schematic perspective view in which a power generation side insulating holder and a drive side insulating holder are omitted from the bus bar module shown in FIG. 3.

FIG. 3 is a schematic perspective view of the bus bar module to which the bus bar unit according to the first embodiment is applied. FIG. 4 is a schematic perspective view in which the power generation side insulating holder and the drive side insulating holder are omitted from the bus bar module shown in FIG. 3. The detailed configuration of the bus bar module to which the bus bar unit according to the first embodiment is applied will be described below with reference to FIGS. 2 to 4.

The bus bar module 40 comprises a terminal block 41, a power generation side bus bar unit 42, a drive side bus bar unit 43 (bus bar unit), a power generation side current sensor 11, and a drive side current sensor 15, as illustrated in FIGS. 2-4. The power generation side bus bar unit 42 comprises a power generation side insulating holder 42H, and the U-phase, V-phase, and W-phase power generation side bus bars 42U, 42V, 42W. The drive side bus bar unit 43 comprises a drive side insulating holder 43H, and the U-phase, V-phase, and W-phase power generation side bus bars 43U, 43V, 43W.

The terminal block 41 is made of resin, or the like. The terminal block 41 is disposed between the inner wall 20a of the main body portion 20, and the power generation side current sensor 11 and the drive side current sensor 15, as illustrated in FIG. 2. The terminal block 41 supports the U-phase, V-phase, and W-phase power generation side bus bars 42U, 42V, 42W and the U-phase, V-phase, and W-phase drive side bus bars 43U, 43V, 43W, as illustrated in FIG. 2. In the terminal block 41, the U-phase, V-phase, and W-phase power generation side bus bars 42U, 42V, 42W and power generation side heavy current connector terminals 52U, 52V, 52W corresponding to the respective phases of the U-phase, V-phase, and W-phase, are fastened with bolts 19, as illustrated in FIGS. 2 and 4. The power generation heavy current connector terminals 52U, 52V, 52W are connector terminals that are connected to the power generation motor/generator 1. In the terminal block 41, the U-phase, V-phase, and W-phase drive side bus bars 43U, 43V, 43W and drive side heavy current connector terminals 53U, 53V, 53W corresponding to the respective phases of the U-phase, V-phase, and W-phase, are fastened with bolts 19, as illustrated in FIGS. 2 and 4. The drive side heavy current connector terminals 53U, 53V, 53W are connector terminals that are connected to the drive motor/generator 2. Additionally, the power generation side current sensor 11 and the drive side current sensor 15 are fastened to the terminal block 41 with bolts 19, as illustrated in FIGS. 3 and 4.

The power generation side insulating holder 42H is made of resin, or the like. The power generation side insulating holder 42H is disposed between the inner wall 20a of the main body portion 20 and the power generation side substrate 17, as illustrated in FIG. 2. The power generation side insulating holder 42H holds the power generation side bus bars 42U, 42V, 42W, as illustrated in FIGS. 2 and 3. The power generation side insulating holder 42H electrically insulates between the three power generation side bus bars 42U, 42V, 42W, as illustrated in FIGS. 2 and 3.

The U-phase, V-phase, and W-phase power generation side bus bars 42U, 42V, 42W are made of conductive material, such as copper. The U-phase, V-phase, and W-phase power generation side bus bars 42U, 42V, 42W correspond to the power generation side three-phase wiring 4A (refer to FIG. 1) that connects the power generation motor/generator 1 and the power generation side semiconductor modules 12a-12c, as illustrated in FIG. 2, etc. That is, each of the terminals on one end sides of the U-phase, V-phase, and W-phase power generation side bus bars 42U, 42V, 42W is fastened to each of the power generation side AC terminals 12U, 12V, 12W with bolts 19, as illustrated in FIG. 2, etc. Each of the terminals on the other end sides of the U-phase, V-phase, and W-phase power generation side bus bars 42U, 42V, 42W is fastened to each of the power generation side heavy current connector terminals 52U, 52V, 52W with bolts 19, as illustrated in FIG. 2, etc. Consequently, the U-phase, V-phase, and W-phase power generation side bus bars 42U, 42V, 42W are bent and extend between the power generation motor/generator 1 and the power generation side semiconductor modules 12a-12c, as illustrated in FIGS. 3 and 4. In addition, the U-phase power generation side bus bar 42U extends from the U-phase power generation side AC terminal 12U to the power generation side heavy current connector terminal 52U that corresponds to the U-phase, via a power generation side U-phase current sensor 11U, as described further below, and as illustrated in FIGS. 2 to 4. The V-phase power generation side bus bar 42V extends from the V-phase power generation side AC terminal 12V to the power generation side heavy current connector terminal 52V that corresponds to the V-phase, via a power generation side V-phase current sensor 11V, as described further below, and as illustrated in FIGS. 2 to 4. The W-phase power generation side bus bar 42W extends from the W-phase power generation side AC terminal 12W to the power generation side heavy current connector terminal 52W that corresponds to the W-phase, as illustrated in FIGS. 2 to 4.

The drive side insulating holder 43H is made of resin, or the like. The drive side insulating holder 43H is disposed between the inner wall 20a of the main body portion 20 and the drive side substrate 18, as illustrated in FIG. 2. The drive side insulating holder 43H holds the three drive side bus bars 43U, 43V, 43W, as illustrated in FIGS. 2 and 3. The drive side insulating holder 43H electrically insulates between the three drive side bus bars 43U, 43V, 43W, as illustrated in FIGS. 2 and 3.

The U-phase, V-phase, and W-phase drive side bus bars 43U, 43V, 43W are made of a conductive material, such as copper. The U-phase, V-phase, and W-phase drive side bus bars 43U, 43V, 43W correspond to the drive side three-phase wiring 4B (refer to FIG. 1) that connects the drive motor/generator 2 and the drive side semiconductor modules 14a-14c, as illustrated in FIG. 2, etc. That is, each of the terminals on one end side of the U-phase, V-phase, and W-phase drive side bus bars 43U, 43V, 43W is fastened with bolts 19 to each of the drive side AC terminals 14U, 14V, 14W, as illustrated in FIG. 2, etc. Each of the terminals on the other end sides of the U-phase, V-phase, and W-phase drive side bus bars 43U, 43V, 43W is fastened with bolts 19 to each of the drive side heavy current connector terminals 53U, 53V, 53W, as illustrated in FIG. 2, etc. Consequently, the U-phase, V-phase, and W-phase drive side bus bars 43U, 43V, 43W are bent and extend between the drive motor/generator 2 and the drive side semiconductor modules 14a-14c as illustrated in FIGS. 3 and 4. In addition, the U-phase drive side bus bar 43U extends from the U-phase drive side AC terminal 14U to the drive side heavy current connector terminal 53U that corresponds to the U-phase, via a drive side U-phase current sensor 15U, as described further below, and as illustrated in FIGS. 2 to 4. The V-phase drive side bus bar 43V extends from the V-phase drive side AC terminal 14V to the drive side heavy current connector terminal 53V that corresponds to the V-phase, via a drive side V-phase current sensor 15V, as described further below, and as illustrated in FIGS. 2 to 4. The W-phase drive side bus bar 43W extends from the W-phase drive side AC terminal 14W to the drive side heavy current connector terminal 53W that corresponds to the W-phase, as illustrated in FIGS. 2 to 4.

The power generation side current sensor 11 is disposed between the terminal block 41 and the power generation side substrate 17, as illustrated in FIG. 2. The power generation side current sensor 11 has a power generation side U-phase current sensor 11U and the power generation side V-phase current sensor 11V, as illustrated in FIGS. 2 to 4. The power generation side U-phase current sensor 11U is disposed between the power generation side V-phase current sensor 11V and the drive side U-phase current sensor 15U, in the middle of the U-phase power generation side bus bar 42U, as illustrated in FIGS. 2 to 4. The power generation side V-phase current sensor 11V is disposed between the inner wall 20a of the main body portion 20 and the power generation side U-phase current sensor 11U, in the middle of the V-phase power generation side bus bar 42V, as illustrated in FIGS. 2 to 4.

The drive side current sensor 15 is disposed between the terminal block 41 and the drive side substrate 18, as illustrated in FIG. 2. The drive side current sensor 15 has the drive side U-phase current sensor 15U and the drive side V-phase current sensor 15V, as illustrated in FIGS. 2 to 4. The drive side U-phase current sensor 15U is disposed between the power generation side U-phase current sensor 11U and the drive side V-phase current sensor 15V, in the middle of the U-phase drive side bus bar 43U, as illustrated in FIGS. 2 to 4. The drive side V-phase current sensor 15V is disposed between the inner wall 20a of the main body portion 20 and the drive side U-phase current sensor 15U, in the middle of the V-phase drive side bus bar 43V, as illustrated in FIGS. 2 to 4.

Detailed Configuration of the Drive Side Bus Bar Unit

Figure 5:
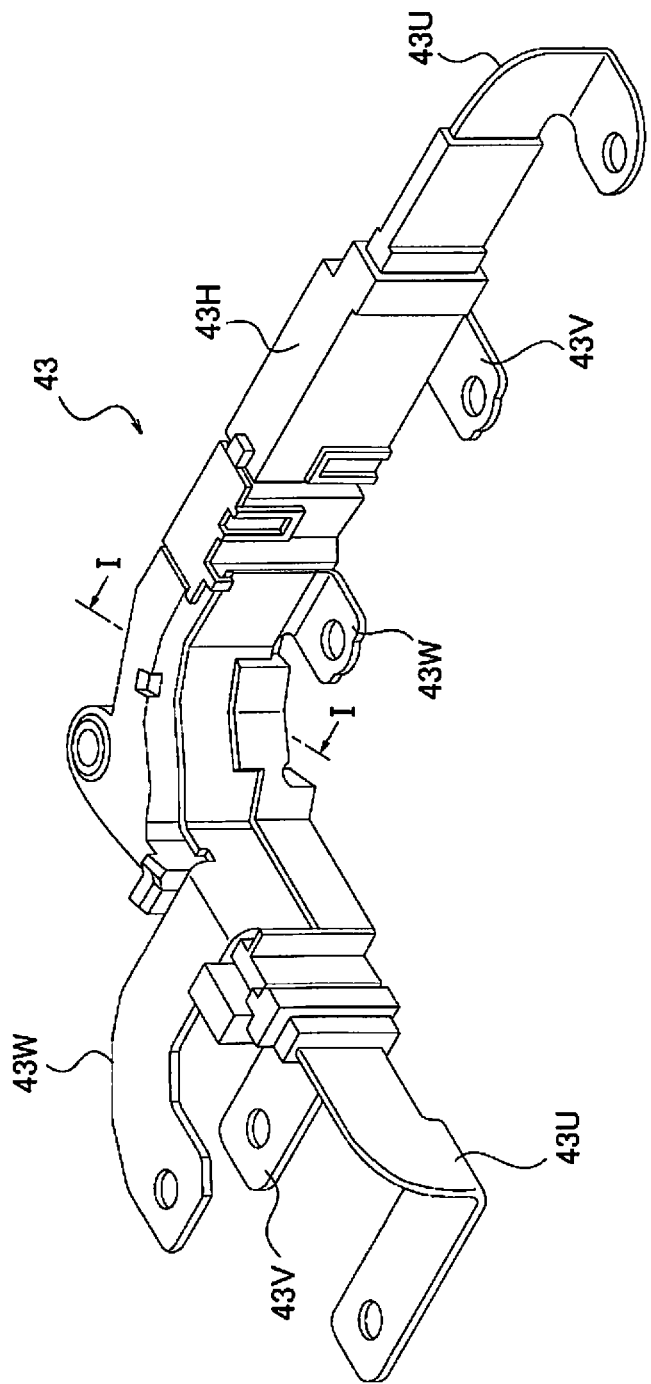
FIG. 5 is a schematic perspective view illustrating the drive side insulating holder and a drive side bus bar in the bus bar unit according to the first embodiment.
Figure 6:
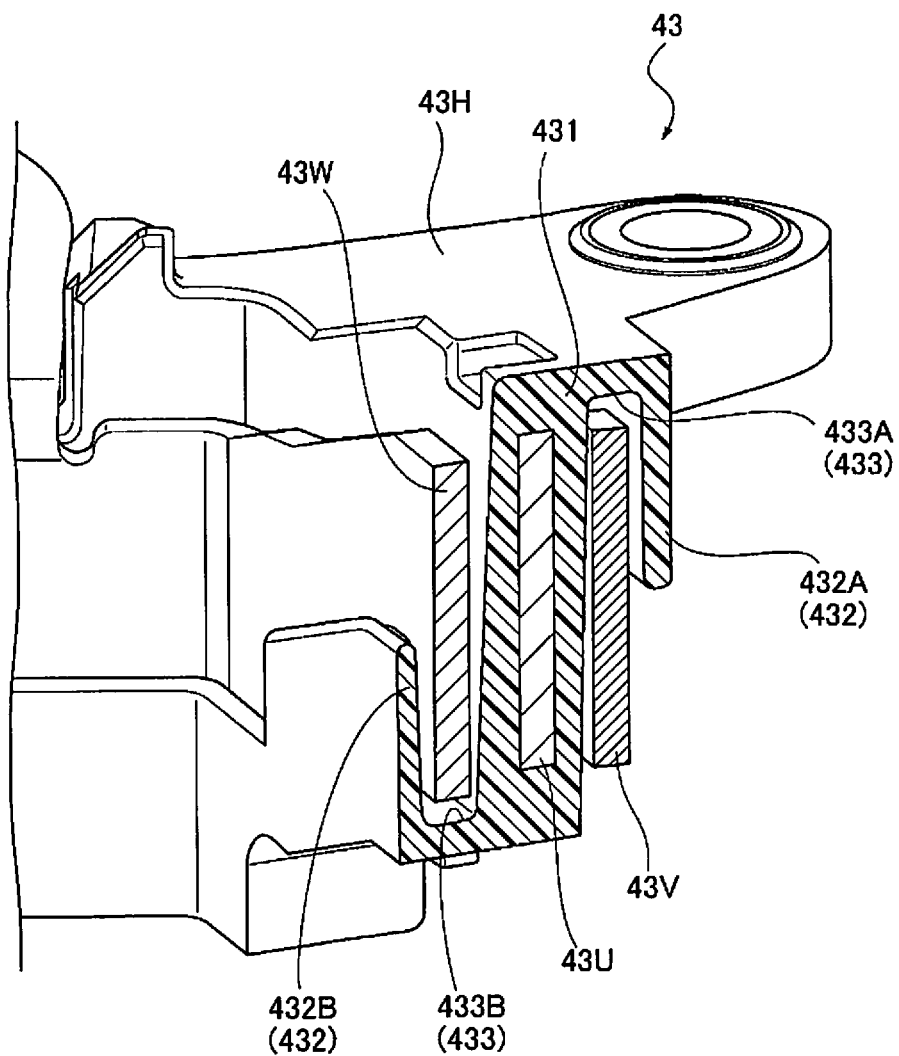
FIG. 6 is a schematic cross-sectional view illustrating a cross section of the bus bar unit according to the first embodiment, taken along line I-I of FIG. 5.
Figure 7:
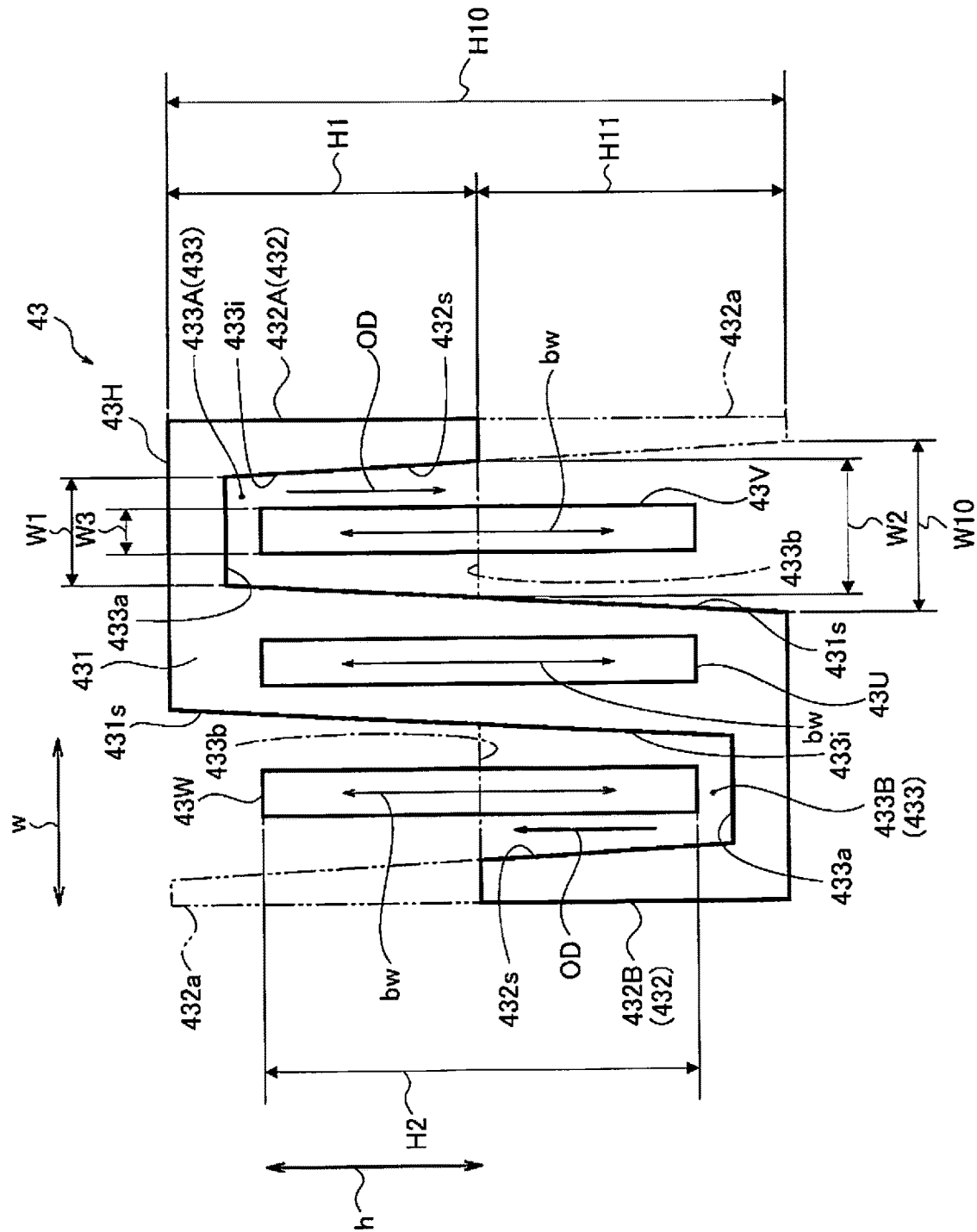
FIG. 7 is a schematic end view illustrating the end surface of the bus bar unit according to the first embodiment, which is a simplified end view of the schematic cross-sectional view of FIG. 6.
Figure 8:
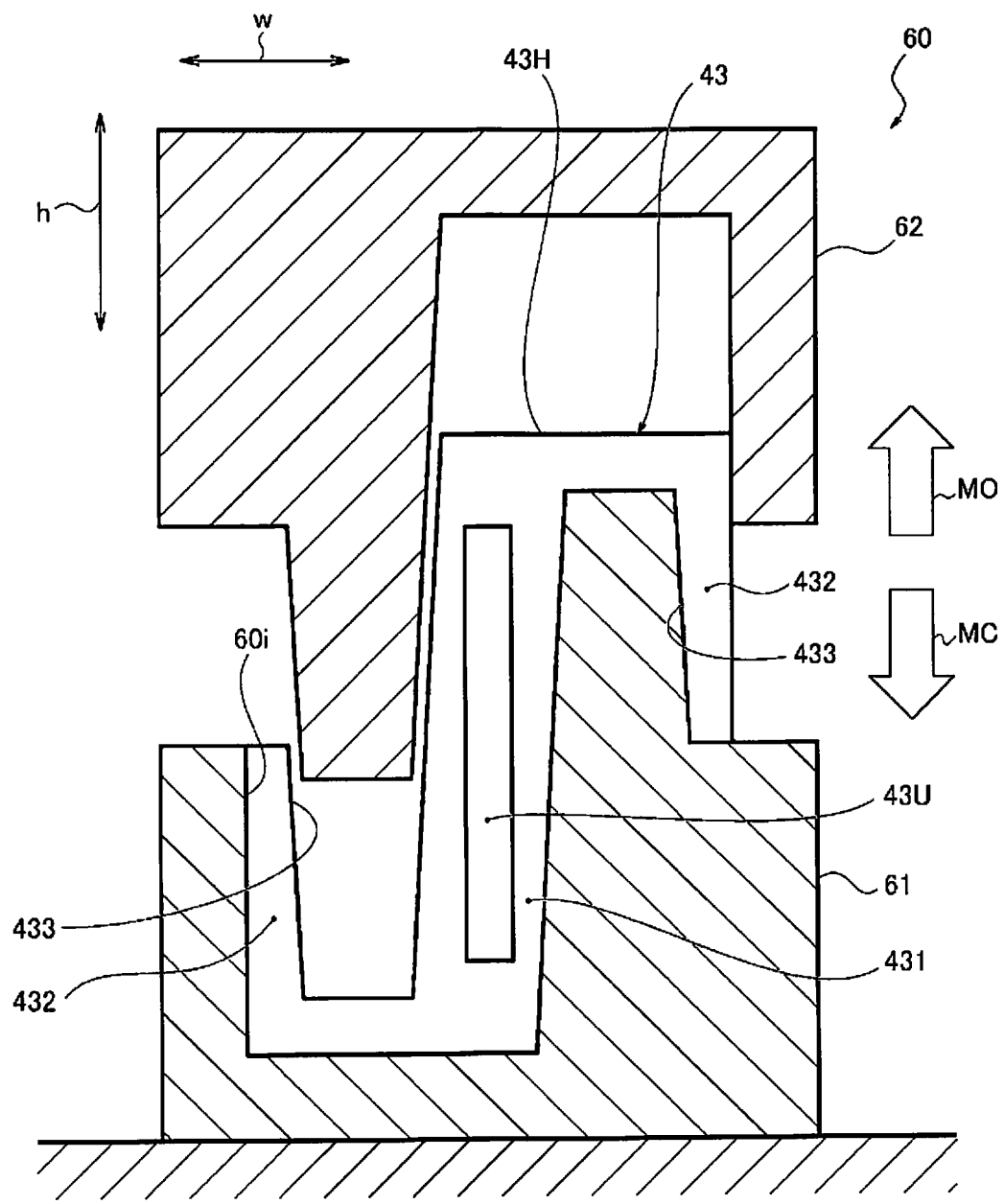
FIG. 8 is a schematic view of a metal mold for molding the drive side insulating holder in the bus bar unit according to the first embodiment, showing a mold open state.

FIG. 5 is a schematic perspective view of the drive side insulating holder and the drive side bus bar in the bus bar unit according to the first embodiment. FIG. 6 illustrates a schematic cross-sectional view of the bus bar unit according to the first embodiment. FIG. 7 illustrates a schematic end view of the bus bar unit according to the first embodiment. FIG. 8 is a schematic view of a metal mold for molding the drive side insulating holder in the bus bar unit according to the first embodiment, showing a mold open state. The detailed configuration of the drive side insulating holder according to the first embodiment will be described below with reference to FIGS. 5 to 8.

The drive side insulating holder 43H is bent and extends in accordance with the shapes of the three drive side bus bars 43U, 43V, 43W, as illustrated in FIG. 5. The drive side insulating holder 43H is provided in the middle of the three drive side bus bars 43U, 43V, 43W, as illustrated in FIG. 5. The drive side insulating holder 43H holds the three drive side bus bars 43U, 43V, 43W, which are arranged in parallel, as illustrated in FIG. 7. These three drive side bus bars 43U, 43V, 43W are arranged in parallel to each other. That is, the drive side insulating holder 43H holds the three drive side bus bars 43U, 43V, 43W in parallel, in a vertically positioned state in which the width directions bw of the drive side bus bars 43U, 43V, 43W are aligned in the height direction h, as illustrated in FIG. 7. Although not shown in FIGS. 6 and 7, the drive side bus bars 43V, 43W are in contact with the drive side insulating holder 43H in the middle of the drive side insulating holder 43H. Here, the "vertically positioned state in which the width directions bw of the drive side bus bars 43U, 43V, 43W are aligned in the height direction h" means that the widths of the drive side bus bars 43U, 43V, 43W become the "heights H2 defined by the widths of the drive side bus bars 43U, 43V, 43W," because the drive side bus bars 43U, 43V, 43W are vertically positioned in the drive side insulating holder 43H, as illustrated in FIG. 7, etc.

The drive side insulating holder 43H includes a molded portion 431, wall portions 432, and bus bar holding grooves 433 (groove portions), as illustrated in FIGS. 6 and 7.

The molded portion 431 is disposed between the wall portions 432 at both ends (bus bar holding grooves 433 at both ends), as illustrated in FIGS. 6 and 7. Mold side surfaces 431s, 431s of the molded portion 431 are inclined surfaces that are inclined relative to the height direction h, as illustrated in FIG. 7. The two mold side surfaces 431s, 431s are parallel, as illustrated in FIG. 7. The molding target of the molded portion 431 is the U-phase drive side bus bar 43U in the middle of the three parallel drive side bus bars 43U, 43V, 43W, as illustrated in FIGS. 6 and 7. The molded portion 431 is obtained by molding the entire periphery of the U-phase drive side bus bar 43U (one bus bar) with resin, or the like, as illustrated in FIGS. 6 and 7. The width direction bw of the U-phase drive side bus bar 43U is parallel to the height direction h (the same applies to the width directions bw of the drive side bus bars 43V, 43W), as illustrated in FIG. 7. The two remaining drive side bus bars 43V, 43W are not molded and are exposed, as illustrated in FIGS. 6 and 7. In addition, when the drive side insulating holder 43H is molded, the U-phase drive side bus bar 43U is set in a metal mold 60, and the molded portion 431 is formed by insert molding, integrally with the drive side insulating holder 43H (refer to FIG. 8). Here, the molding method (manufacturing method) for the drive side insulating holder 43H will be described (refer to FIG. 8). The drive side insulating holder 43H is molded with the metal mold 60. First, the metal mold 60 composed of a fixed die 61 and a movable die 62 is opened (mold open direction MO). Next, the U-phase drive side bus bar 43U is set in the metal mold 60. Next, the movable die 62 is moved toward the fixed die 61 (mold close direction MC) to close the metal mold 60. Subsequently, resin is injected into the mold. Next, the injected resin is solidified inside the mold. Next, the metal mold 60 is opened in the mold open direction MO, to remove the molded article (drive side insulating holder 43H, product), as illustrated in FIG. 8.

The wall portions 432 are provided one each in positions spaced apart from the two mold side surfaces 431s in the width direction w, as illustrated in FIGS. 6 and 7. The wall side surfaces 432s of the wall portions 432, 432s on the molded portion 431 side are inclined surfaces that are inclined relative to the height direction h, as illustrated in FIG. 7. The two wall side surfaces 432s, 432s are parallel, as illustrated in FIG. 7. The mold side surfaces 431s and the wall side surfaces 432s are not parallel, as illustrated in FIG. 7. Moreover, of the wall portions 432, the V-phase drive side bus bar 43V side is referred to as a first wall portion 432A, and the W-phase drive side bus bar 43W side is referred to as a second wall portion 432B, as illustrated in FIG. 7.

The height H1 of the wall portions 432 is set lower than the height H2 defined by the width of the drive side bus bars 43V, 43W (bus bar) (H1<H2), as illustrated in FIG. 7. The height H1 of the wall portions 432 according to the first embodiment is set to be about half of the height H2 defined by the widths of the drive side bus bars 43V, 43W. The height H1 of the wall portions 432 is lower than a height H10 that is equivalent to or higher than the height H2 defined by the widths of the drive side bus bars 43V, 43W, by about a height H11 (virtual wall portion 432a) (H2≤H10), as illustrated in FIG. 7. Here, this "height H1 of the wall portions 432" is set in accordance with the holding of the drive side bus bars 43V, 43W, a required insulation distance (spatial distance and creepage distance), and the like. The height H1 of the wall portions 432 is set to a height at which it is possible to hold the drive side bus bars 43V, 43W. Moreover, the height H1 of the wall portions 432 is set based on the required insulation distance. The required insulation distance is the distance required to ensure an electrical insulation performance without molding the spaces between two or more conductive members (drive side bus bars 43V, 43W) with an insulating material (resin, or the like). This required insulation distance changes depending on the voltage, etc., that is applied to the drive side bus bars 43V, 43W, which are not molded.

The bus bar holding grooves 433 are provided on both sides of the molded portion 431, and are provided between the molded portion 431 and the wall portions 432, as illustrated in FIGS. 6 and 7. The bus bar holding grooves 433 are composed of a portion of the mold side surfaces 431s, the wall side surfaces 432s, and groove bottom portions 433a, as illustrated in FIGS. 6 and 7. The bus bar holding grooves 433 hold the two drive side bus bars 43V, 43W, respectively (remaining bus bars, two remaining bus bars), as illustrated in FIGS. 6 and 7. The width of the bus bar holding grooves 433 on the inner surface 433i side is set to become wider from the groove bottom portions 433a toward groove openings 433b, as illustrated in FIG. 7. That is, the width W2 of the groove openings 433b is set wider than the width W1 of the groove bottom portions 433a (W1<W2), as illustrated in FIG. 7. In addition, the width W1 of the groove bottom portions 433a and the width W2 of the groove openings 433b are set wider than a width W3 defined by the thicknesses of the drive side bus bars 43V, 43W (the same as the width defined by the drive side bus bar 43U). The width W2 of the groove openings 433b is set to a width when the height of the wall portions 432 is H1, relative to the width W10 of the groove openings when the height of the wall portions 432 is H10 (W2<W10). Among the bus bar holding grooves 433, a space between the molded portion 431 and the first wall portion 432A is referred to as a first bus bar holding groove 433A (first groove), and a space between the molded portion 431 and the second wall portion 432B is referred to as a second bus bar holding groove 433B (second groove portion), as illustrated in FIG. 7.

The first bus bar holding groove 433A and the second bus bar holding groove 433B have different opening directions OD (direction from the groove bottom portions 433a to the groove openings 433b) of the bus bar holding grooves 433, as illustrated in FIG. 7. That is, the opening directions OD for the first bus bar holding groove 433A and the second bus bar holding groove 433B are different from each other. In addition, the first bus bar holding groove 433A holds the V-phase drive side bus bar 43V, as illustrated in FIG. 7. The second bus bar holding groove 433B holds the W-phase drive side bus bar 43W, as illustrated in FIG. 7.

The actions are described next. The operation of the bus bar unit according to the first embodiment will be described separately with respect to the "basic characteristic action of the drive side bus bar unit" and "characteristic action of the drive side bus bar unit."

Basic Characteristic Action of the Drive Side Bus Bar Unit

For example, conventionally, a stator (not shown) has an insulating holder that electrically insulates between a plurality of bus bars. These insulating holders have partition wall portions between the bus bars, and have holding grooves for holding the bus bars between the partition wall portions. The bus bars are inserted into these holding grooves. The height of the partition wall portions (depth of the holding grooves) is set higher than the height defined by the width of the vertically positioned bus bars in order to ensure the creepage distance and to ensure the insulation performance, and the bus bars are accommodated inside the holding grooves. Moreover, in a conventional stator, it is possible to miniaturize the motor (not shown) by employing the configuration described above.

However, in the conventional stator, in order to ensure the creepage distance, the height of the partition wall portions must be made higher than the height defined by the width of the bus bars. Moreover, in order to miniaturize the motor, the width of the partition wall portions (that is, the width of the insulating holder) cannot be increased. Consequently, if an external force is applied to the partition wall portion, there is the risk that the partition wall portion will be damaged, and there is a problem in that there is room for improvement in durability and reliability.

In contrast, in the first embodiment, the drive side insulating holder 43H has a molded portion 431 in which the entire periphery of the one U-phase drive side bus bar 43U, from among the three drive side bus bars 43U, 43V, 43W, is molded. In addition, the drive side insulating holder 43H has the wall portions 432 that are provided in positions spaced apart from the mold side surfaces 431s of the molded portions 431 and that insulate between the two drive side bus bars 43V, 43W. Furthermore, the drive side insulating holder 43H has bus bar holding grooves 433, in which the remaining drive side bus bars 43V, 43W are held, between the molded portion 431 and the wall portions 432. Moreover, the height H1 of the wall portions 432 is set lower than the height H2 defined by the width of the drive side bus bars 43U, 43V, 43W (FIGS. 6 and 7). That is, since the entire periphery of the U-phase drive side bus bar 43U is molded, the drive side bus bar 43U of the molded portion 431 and the remaining drive side bus bars 43V, 43W are insulated. In addition, the drive side bus bars 43V, 43W are insulated by the wall portions 432. Since the height H1 of the wall portions 432 is set lower than the height H2 defined by the width of the drive side bus bars 43U, 43V, 43W, the strength of the wall portions 432 with respect to external force is improved, compared to a case in which the height H1 of the wall portions 432 is set equal to or higher than the height H2 defined by the width of the bus bars (for example, height H10). As a result, the durability and reliability of the drive side insulating holder 43H are improved while ensuring the insulation performance.

Figure 9:
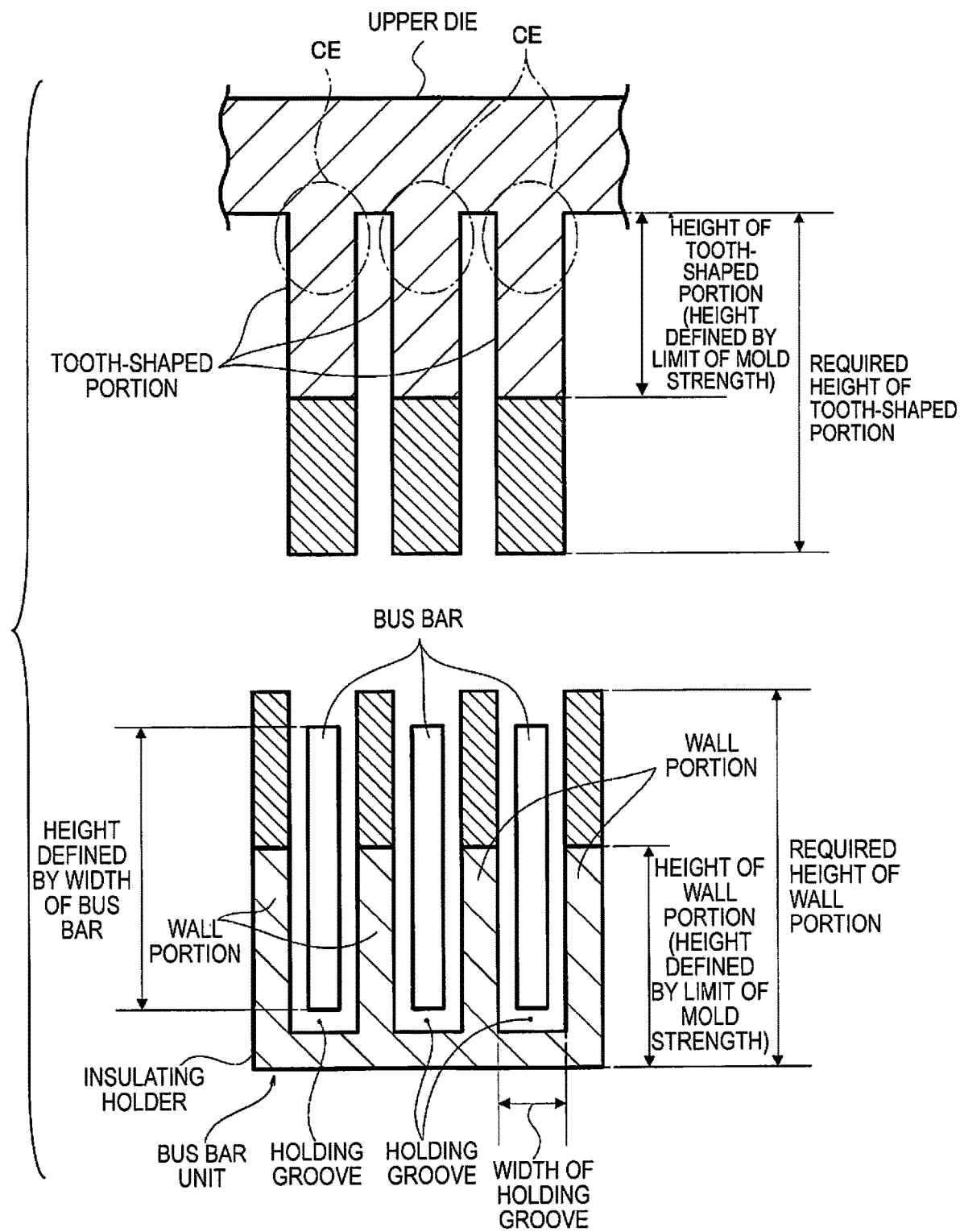
FIG. 9 is a schematic end view illustrating the insulating holder, the bus bars, and an upper die in the bus bar unit according to a conventional example.

Next, the problem of the conventional metal mold will be described. FIG. 9 is a schematic end view of the insulating holder, the bus bars, and the upper die in the bus bar unit according to a conventional example. The problem thereof will be described with reference to FIG. 9. The metal mold is illustrated showing only a portion of the upper die, and the lower die is omitted.

In the conventional stator, if the height defined by the width of the bus bar becomes high, it is necessary to increase the height of the wall portions to the required wall portion height to ensure the creepage distance. However, due to restrictions of the mold strength of the metal mold for forming the insulating holder, it is difficult to make the height of the wall portions higher than the height defined by the limit of the mold strength. That is, when forming the wall portion with a metal mold, the metal mold used for the wall portions and the holding grooves between the wall portions has a tooth shape. Consequently, when the height of the wall portions is set to the required height of the wall portions that is higher than the height defined by the limit of the mold strength, the tooth-shaped portion becomes elongated in accordance with the shape of the holding grooves. That is, the height of the tooth-shaped portion must be set to the required height of the tooth-shaped portion that is higher than the height defined by the limit of the mold strength. Consequently, the strength of the tooth-shaped portion becomes relatively weak with respect to the pressure during molding. Therefore, there is the risk that the tooth-shaped portion of the metal mold (in particular, portion CE shown in FIG. 9) will be damaged, etc., when removing the molded article from the metal mold, so there is a problem in that there is room for improvement in the durability and reliability of the metal mold. In other words, if the height of the wall portions is set higher than the height defined by the limit of the mold strength, the mold life could become relatively short, so there is room for extending the mold life. With respect to such a problem, in order to increase the height of the wall portions while improving the durability and reliability, the width of the holding grooves could be increased. However, if the width of the holding grooves is increased, the size of the motor cannot be reduced.

In contrast, in the first embodiment, the drive side insulating holder 43H has a molded portion 431 in which the entire periphery of the one U-phase drive side bus bar 43U, from among the three drive side bus bars 43U, 43V, 43W, is molded. That is, since the drive side bus bar 43U of the molded portion 431 and the remaining drive side bus bars 43V, 43W are insulated, even if the height H1 of the wall portions 432 is set lower than the height H2 defined by the widths of the drive side bus bars 43U, 43V, 43W, the insulation performance is ensured. That is, even if the height H1 of the wall portions 432 is the height defined by the limit of the mold strength of the metal mold, the insulation distance is ensured. In other words, the insulation distance is ensured even if the height H1 of the wall portions 432 is not set to the height defined by the restrictions of the mold strength. Consequently, it is not necessary to increase the widths W1, W2 of the bus bar holding grooves 433. It is thereby possible to suppress the height and the width of the tooth-shaped portion of the metal mold with respect to the bus bar holding grooves 433. Consequently, the durability and reliability of the metal mold are improved while ensuring the required performance (insulation performance and miniaturization). In other words, the mold life of the metal mold is prolonged.

Characteristic Action of the Drive Side Bus Bar Unit

The first embodiment is provided with the first bus bar holding groove 433A and the second bus bar holding groove 433B, which have different opening directions OD for the bus bar holding grooves 433. In addition, the remaining V-phase drive side bus bar 43V is held in the first bus bar holding groove 433A, and the remaining W-phase drive side bus bar 43W is held in the second bus bar holding groove 433B (FIG. 7). That is, it is possible to increase the insulation distance between the V-phase drive side bus bar 43V and the W-phase drive side bus bar 43W compared to a case in which a plurality of groove portions are provided having the same opening directions OD for the groove portion. The remaining two drive side bus bars 43V, 43W are thereby insulated. Therefore, the insulation distance is ensured between the bus bars.

In the first embodiment, the first bus bar holding groove 433A and the second bus bar holding groove 433B, which have different opening directions OD for the bus bar holding grooves 433 from each other are provided on both sides of the molded portion 431. In addition, the remaining V-phase drive side bus bar 43V is held in the first bus bar holding groove 433A, and the remaining W-phase drive side bus bar 43W is held in the second bus bar holding groove 433B, one each (FIG. 7). That is, by provided the first bus bar holding groove 433A and the second bus bar holding groove 433B on both sides of the molded portion 431, it is possible to increase the insulation distance between the V-phase drive side bus bar 43V and the W-phase drive side bus bar 43W, compared to a case in which the first bus bar holding groove 433A and the second bus bar holding groove 433B are provided in adjacent positions. Moreover, it is possible to increase the insulation distance between the V-phase drive side bus bar 43V and the W-phase drive side bus bar 43W compared to a case in which a plurality of groove portions are provided having the same opening directions OD for the groove portion. The remaining two drive side bus bars 43V, 43W are thereby insulated. Therefore, a sufficient insulation distance is ensured between the bus bars.

In the first embodiment, the width of the bus bar holding grooves 433 on the inner surface 433i side is set to become wider from the groove bottom portions 433a toward groove openings 433b (FIGS. 7 and 8). A description is provided below with reference to FIGS. 7 and 8. That is, the inner surfaces 433i of the bus bar holding grooves 433 are inclined from the groove bottom portions 433a toward the groove openings 433b, as illustrated in FIG. 7. Consequently, when the drive side insulating holder 43H is molded with the metal mold 60 and the molded article (drive side insulating holder 43H) is removed (demolded) from the metal mold 60, the inclination of the inner surfaces 433i of the bus bar holding grooves 433 becomes the inclination (draft angle) of the direction in which the molded article is released (mold open direction MO), as illustrated in FIG. 8. That is, when the mold is opened, a gap forms between the movable die 62 and the molded article, as illustrated in FIG. 8. The withdrawal resistance is thereby reduced when the mold is opened. Therefore, the molded article can be smoothly removed from the metal mold 60. Moreover, when the molded article is removed from the metal mold 60, the external force that is applied to the molded article is suppressed.

In addition, in the first embodiment, the two mold side surfaces 431s, 431s are configured to be parallel (FIG. 7). That is, it is possible to keep the width of the entire drive side insulating holder 43H narrow, compared to a case in which a plurality of groove portions with the same opening directions for the groove portion are provided on both sides of the molded portion and the widths of the inner surface sides of these groove portions are set to become wider from the groove bottom portions toward the groove openings. Accordingly, the size of the drive side insulating holder 43H is reduced while ensuring the insulation performance.

In the first embodiment, the height H1 of the wall portions 432 is set based on the required insulation distance between the drive side bus bars 43V, 43W, which are held by the bus bar holding grooves 433 (FIG. 7). That is, if the height H1 of the wall portions 432 can be further decreased according to the required insulation distance, the strength of the wall portions 432 with respect to external force is further improved. Consequently, the durability and reliability of the drive side insulating holder 43H are further improved while ensuring the required insulation performance.

The effects will now be described.
The effects listed below can be obtained according to the bus bar unit of the first embodiment.

(1) A plurality of bus bars (the drive side bus bars 43U, 43V, 43W), and an insulating holder (the drive side insulating holder 43H) that holds the plurality of the bus bars (the drive side bus bars 43U, 43V, 43W) in a parallel arrangement and that insulates between the plurality of the bus bars (the drive side bus bars 43U, 43V, 43W) are provided. In this bus bar unit (the drive side bus bar unit 43), the insulating holder (the drive side insulating holder 43H) includes a molded portion 431 molded around an entire periphery of at least one bus bar (the drive side bus bar 43U) from among the plurality of bus bars (drive side bus bars 43U, 43V, 43W), a wall portion 432 that is provided at a position spaced apart from a side surface (the mold side surface 431s) of the molded portion 431 and that insulates between the plurality of the bus bars (the drive side bus bars 43U, 43V, 43W), and a groove portion (the bus bar holding grooves 433) that holds a remaining bus bar (the drive side bus bars 43V, 43W) between the molded portion 431 and the wall portion 432. The height H1 of the wall portion 432 is set lower than the height H2 defined by the width of the bus bars (the drive side bus bars 43U, 43V, 43W) (FIGS. 6 and 7). Consequently, the durability and reliability of the insulating holder (the drive side insulating holder 43H) are improved while ensuring the insulation performance.

(2) There is a plurality of remaining bus bars (the drive side bus bars 43V, 43W). A first groove portion (the first bus bar holding groove 433A) and a second groove portion (the second bus bar holding groove 433B) are provided, which have different opening directions OD for the groove portion (the bus bar holding grooves 433). The remaining bus bars (the drive side bus bars 43V, 43W) are held by the first groove portion (the first bus bar holding groove 433A) and the second groove portion (the second bus bar holding groove 433B), respectively, (FIG. 7). Therefore, in addition to the effect of (1), it is possible to ensure an insulation distance between the bus bars (the drive side bus bars 43V, 43W).

(3) The number of the plurality of the bus bars is three (the drive side bus bars 43U, 43V, 43W). Of the three bus bars (the drive side bus bars 43U, 43V, 43W), one is molded in the molded portion 431 about the entire periphery of the bus bar (the drive side bus bar 43U) is molded. The first groove portion (the first bus bar holding groove 433A) and the second groove portion (the second bus bar holding groove 433B), which have different opening directions OD for the groove portion (the bus bar holding grooves 433), are provided, one each on both sides of the molded portion 431. One of each of the remaining two bus bars (the drive side bus bars 43V, 43W) is held respectively by the first groove portion (the first bus bar holding groove 433A) and the second groove portion (the second bus bar holding groove 433B) (FIG. 7). Consequently, in addition to the effect of (2), it is possible to ensure a sufficient insulation distance between the bus bars (the drive side bus bars 43V, 43W).

(4) The width of the groove portion (the bus bar holding grooves 433) on the inner surface 433i side is set to become wider from the groove bottom portion 433a toward the groove opening 433b (FIGS. 7 and 8). Consequently, in addition to the effects of (1) to (3), it is possible to smoothly remove the molded article (the drive side insulating holder 43H) from the metal mold 60.

(5) The height H1 of the wall portion 432 is set based on the required insulation distance between the bus bar (the drive side bus bars 43V, 43W), which is held by the groove portion (the bus bar holding grooves 433) (FIG. 7). Consequently, in addition to the effects of (1) to (4), the durability and reliability of the insulating holder (the drive side insulating holder 43H) are further improved while ensuring the required insulation performance.

Second Embodiment

Unlike the first embodiment, the second embodiment is a modified example in which the width of the inner surface 433i sides of the bus bar holding grooves 443 is set to be the same width from groove portions 443a to groove openings 443b.

The configuration will be described first.

The bus bar unit according to the second embodiment is applied to a bus bar unit of an inverter device of a motor/generator that is mounted on a range extender electric vehicle as a travel drive source, or the like, in the same manner as in the first embodiment. Moreover, the "circuit configuration of the drive system," the "configuration of the inverter device," and the "detailed configuration of the bus bar module," of the bus bar unit according to the second embodiment are the same as in the first embodiment, so that illustrations and descriptions thereof are omitted. The "detailed configuration of the drive side bus bar unit" in the second embodiment will be described below.

Detailed Configuration of the Drive Side Bus Bar Unit

Figure 10:
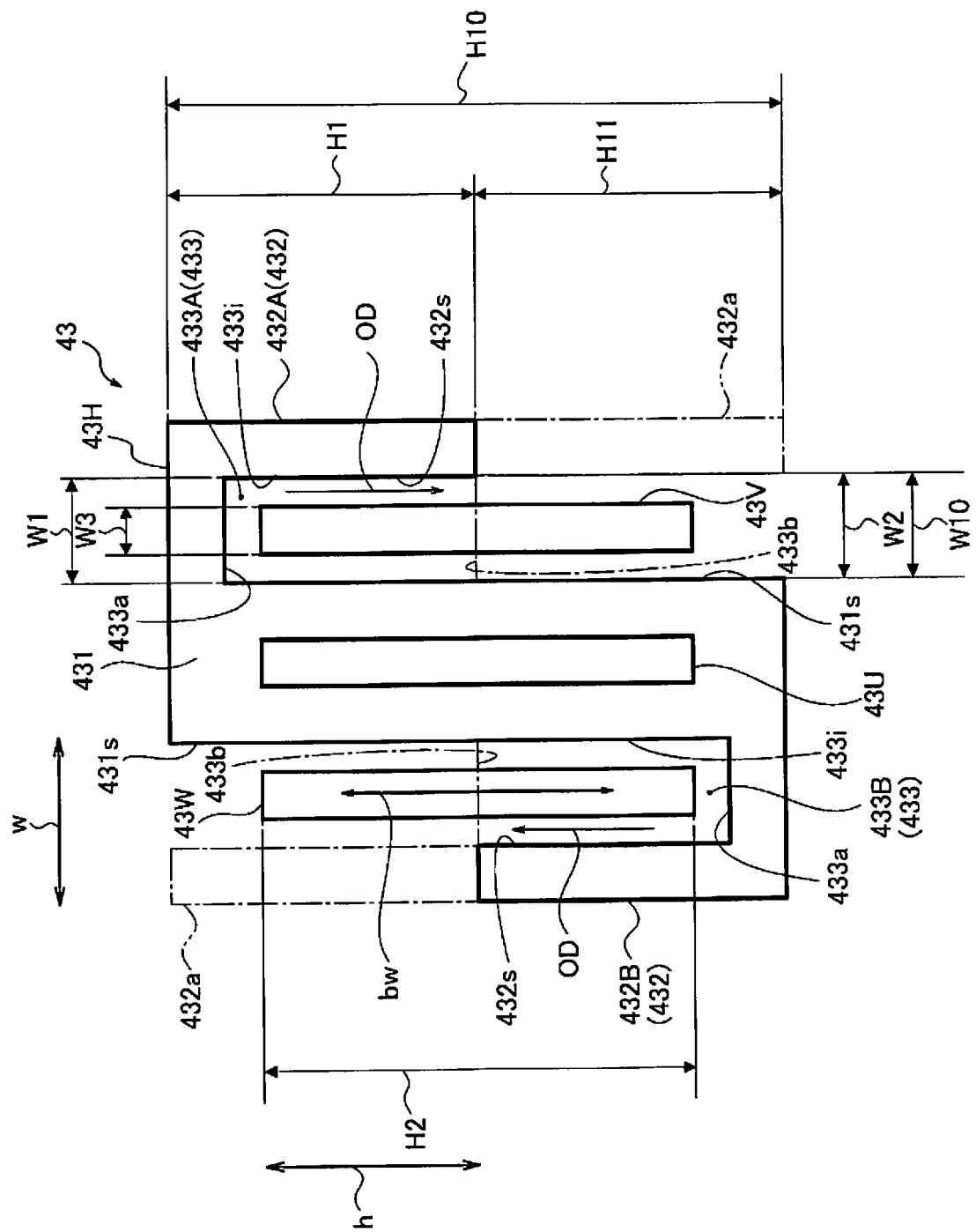
FIG. 10 is a schematic end view illustrating the end surface of the bus bar unit according to a second embodiment.

FIG. 10 illustrates a schematic end view of the bus bar unit according to the second embodiment. The detailed configuration of the drive side insulating holder according to the second embodiment will be described below with reference to FIG. 10.

The drive side insulating holder 43H includes a molded portion 431, wall portions 432, and bus bar holding grooves 433 (the groove portions), as illustrated in FIG. 10.

The mold side surfaces 431s, 431s of the molded portion 431 are parallel surfaces that are parallel to the height direction h, as illustrated in FIG. 10. The other actions are the same as the molded portion 431 of the first embodiment, so that the descriptions thereof are omitted.

Of the wall portions 432, the wall side surfaces 432s, 432s on the molded portion 431 side are parallel surfaces parallel to the height direction h, as illustrated in FIG. 10. Consequently, the mold side surfaces 431s, 431s and the wall side surfaces 432s, 432s of the molded portion 431 side are parallel. The other configurations are the same as the wall portions 432 of the first embodiment, so that the descriptions thereof are omitted.

The width of the bus bar holding grooves 433 on the inner surface 433i side is set to be the same width from the groove bottom portions 433a to the groove openings 433b (equal width). That is, in the second embodiment, the width W2 of the groove openings 433b is set to be equal to the width W1 of the groove bottom portions 433a (W1=W2), as illustrated in FIG. 10. In addition, the width W1 of the groove bottom portions 433a and the width W2 of the groove openings 433b are equal to the width W10 of the groove openings when the height of the wall portions 432 is H10. The other configurations are the same as the bus bar holding grooves 433 of the first embodiment, so that the descriptions thereof are omitted.

The other configurations illustrated in FIG. 10 are the same as those in the first embodiment, so the corresponding configurations are given the same reference symbols and the descriptions thereof are omitted. The other configurations not illustrated in FIG. 10 are the same as those in the first embodiment, so that the descriptions thereof are omitted.

The actions will now be described. The actions of the second embodiment include the same "basic characteristic action of the drive side bus bar unit" as the first embodiment. In addition, with respect to the "characteristic action of the drive side bus bar unit" of the first embodiment, the actions of the second embodiment include, the action of providing the first bus bar holding groove 433A and the second bus bar holding groove 433B whose opening directions OD for the bus bar holding grooves 433 are different, the action of providing the first bus bar holding groove 433A and the second bus bar holding groove 433B whose opening directions OD for the bus bar holding grooves 433 are different on both sides of the molded portion 431, and the action of setting the height H1 of the wall portion 432 based on the required insulation distance.

The effects will now be described. The effects of (1) to (3) and (5) of the first embodiment can be obtained according to the bus bar unit of the second embodiment.

The bus bar unit of the present invention was described above based on the first and second embodiments, but specific configurations thereof are not limited to the first and second embodiments, and various modifications and additions to the design can be made without departing from the scope of the invention according to each claim in the Claims.

In the first and second embodiments, examples were shown in which the entire periphery of the U-phase drive side bus bar 43U is molded as the molded portion 431. However, the invention is not limited in this way. For example, the molded portion can be configured such that the entire periphery of either the V-phase drive side bus bar 43V or the W-phase drive side bus bar 43W is molded. Moreover, the molded portion can be configured such that the entire periphery of two or three drive side bus bars, from among the three drive side bus bars 43U, 43V, 43W, is molded. In short, it suffices if the molded portion 431 is configured such that the entire periphery of at least one of the drive side bus bars is molded.

In the first and second embodiments, examples were shown in which the opening direction OD for the first bus bar holding groove 433A is downward with respect to the height direction h, and the opening direction OD for the second bus bar holding groove 433B is upward with respect to the height direction h. However, the opening directions OD can be reversed. That is, the opening direction OD for the first bus bar holding groove 433A can be upward with respect to the height direction h, and the opening direction OD for the second bus bar holding groove 433B can be downward with respect to the height direction h.

In the first and second embodiments, examples were shown in which the height of the wall portions 432 is set to H1. However, the height H1 of the wall portions 432 can be further decreased depending on the required insulation distance.

In the first and second embodiments, examples were shown in which the drive side insulating holder 43H holds the three drive side bus bars 43U, 43V, 43W in parallel, in a vertically positioned state in which the width directions bw of the drive side bus bars 43U, 43V, 43W are aligned in the height direction h. However, the drive side insulating holder is not limited to a vertically positioned state. For example, the plurality of drive side bus bars can be held in parallel in a horizontally positioned state, or the like. In short, it is sufficient if the insulating holder holds a plurality of bus bars that are arranged in parallel.

Figure 11:
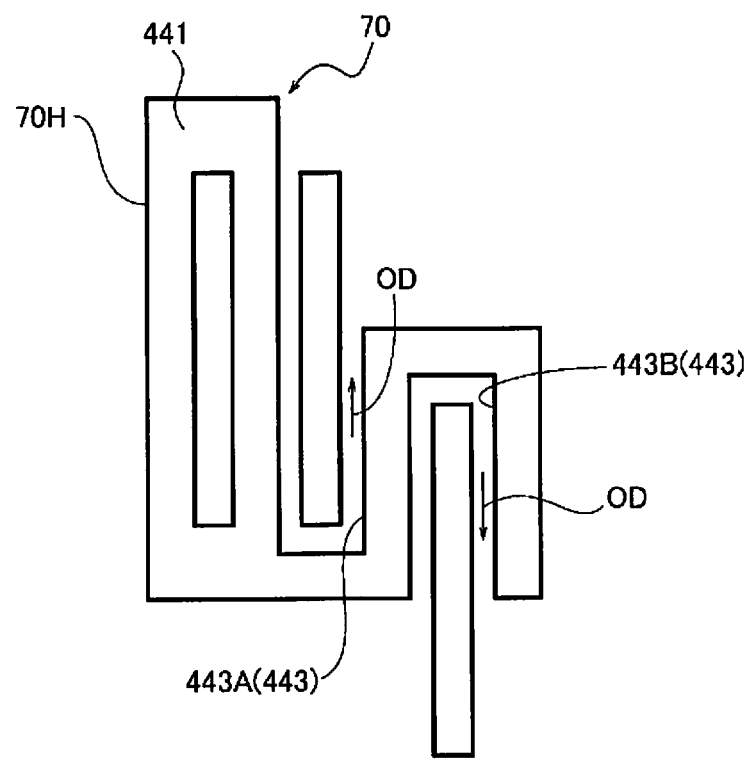
FIG. 11 is a schematic end view illustrating the end surface of a first modified example of the bus bar unit.

In the first and second embodiments, examples were shown in which the bus bar holding grooves 433 are provided on both sides of the molded portion 431. However, the bus bar holding grooves can be provided on only one side of the molded portion. For example, one each of a first groove portion 443A and a second groove portion 443B having different opening directions OD for the bus bar holding grooves 433 can be provided on the right side of a molded portion 441 (first bus bar holding groove 433A side of the first embodiment), as is the case with an insulating holder 70H of a bus bar unit 70 shown in FIG. 11 (first modified example). In addition, one each of a first groove portion and a second groove portion having different opening directions OD for the bus bar holding grooves 433 can be provided on the left side of the molded portion 441 (second bus bar holding groove 433B side of the first embodiment). The opening directions OD for the first groove portion 443A and the second groove portion 443B can be the opposite of those shown in FIG. 11. The effects described in (1)-(2) and (5) of the first embodiment can also be obtained with such a configuration. In addition, in FIG. 11, the width can be set to become wider from the groove bottom portions to the groove openings of the bus bar holding grooves, as in the first embodiment. The effect described in (4) of the first embodiment can be obtained by configuring in this manner. Even with the configuration of FIG. 11, the insulating holder 70H holds a plurality of bus bars that are arranged in parallel.

Figure 12:
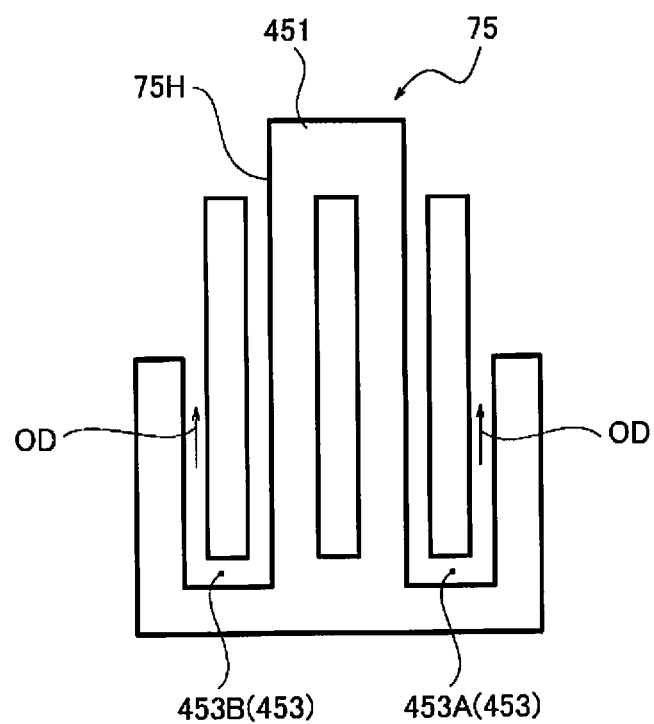
FIG. 12 is a schematic end view illustrating the end surface of a second modified example of the bus bar unit.

In the first and second embodiments, examples were shown in which one each of the first bus bar holding groove 433A and the second bus bar holding groove 433B, which have different opening directions OD for the bus bar holding grooves 433, are provided on both sides of the molded portion 431. However, a first groove portion and a second groove portion whose opening directions OD for the bus bar holding grooves are the same can be provided on both sides of the molded portion. For example, a first groove portion 453A and a second groove portion 453B having the same opening directions OD for bus bar holding grooves 453 can be provided on both sides of a molded portion 451, as is the case with an insulating holder 75H of a bus bar unit 75 shown in FIG. 12 (second modified example). The opening directions OD for the first groove portion 453A and the second groove portion 453B can be the opposite of those shown in FIG. 12. The effects described in (1)-(2) and (5) of the first embodiment can also be obtained with such a configuration. In addition, in FIG. 12, the width can be set to become wider from the groove bottom portions to the groove openings of the bus bar holding grooves, as in the first embodiment. The effect described in (4) of the first embodiment can be obtained by configuring in this manner.

Figure 13:
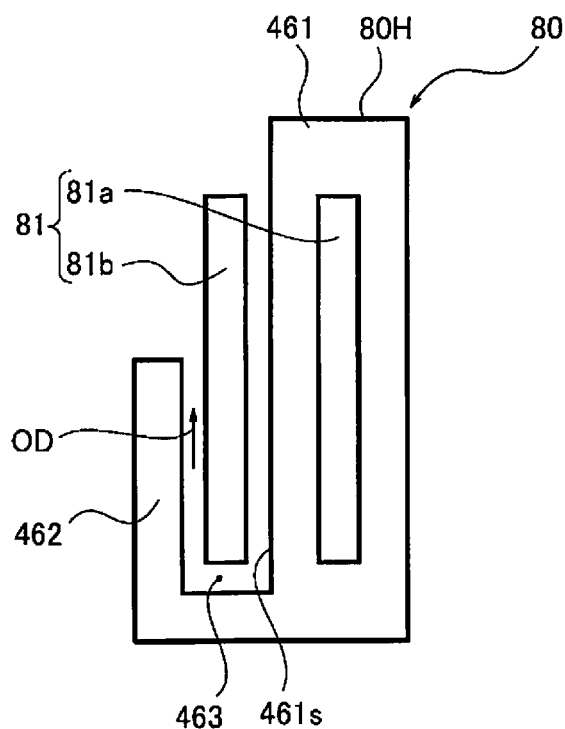
FIG. 13 is a schematic end view illustrating the end surface of a third modified example of the bus bar unit.

In the first and second embodiments, examples were shown in which there are three drive side bus bars 43U, 43V, 43W. However, it suffices if there are two or more. For example, it can be configured such that there are two bus bars 81, of which the entire periphery of one bus bar 81a is molded and the other bus bar 81b is held by a bus bar holding groove 463, as is the case with an insulating holder 80H of a bus bar unit 80 shown in FIG. 13 (third embodiment). The position of the bus bar holding grooves 463 can be on the left side of the molded portion 461 (second bus bar holding groove 433B side of first embodiment) as shown in FIG. 13, or the on right side of the molded portion 461 (first bus bar holding groove 433A side of the first embodiment). That is, it suffices if the wall portion 462 is provided in a position spaced apart from one mold side surface 461s of the molded portion 461. The opening directions OD for the bus bar holding grooves 463 can be the opposite of those shown in FIG. 13. The effect described in (1) of the first embodiment can be obtained by configuring in this manner. In addition, in FIG. 13, the width can be set to become wider from the groove bottom portions to the groove openings of the bus bar holding grooves, as in the first embodiment. The effect described in (4) of the first embodiment can be obtained by configuring in this manner. Moreover, in FIG. 13, because the entire periphery of one bus bar 81a is molded, the two bus bars 81a, 81b are insulated. As a result, it suffices if the height of the wall portions 462 that constitute the bus bar holding grooves 463 is set to a height with which it is possible to hold the remaining bus bar 81b, so it is not necessary to consider the insulation distance between the two bus bars 81a, 81b. As a result, it is possible to further lower the height of the wall portions 462, and the strength of the wall portions 462 with respect to external force is further improved. Consequently, the durability and reliability of the insulating holder 80H are further improved while ensuring the required insulation performance.

Figure 14:
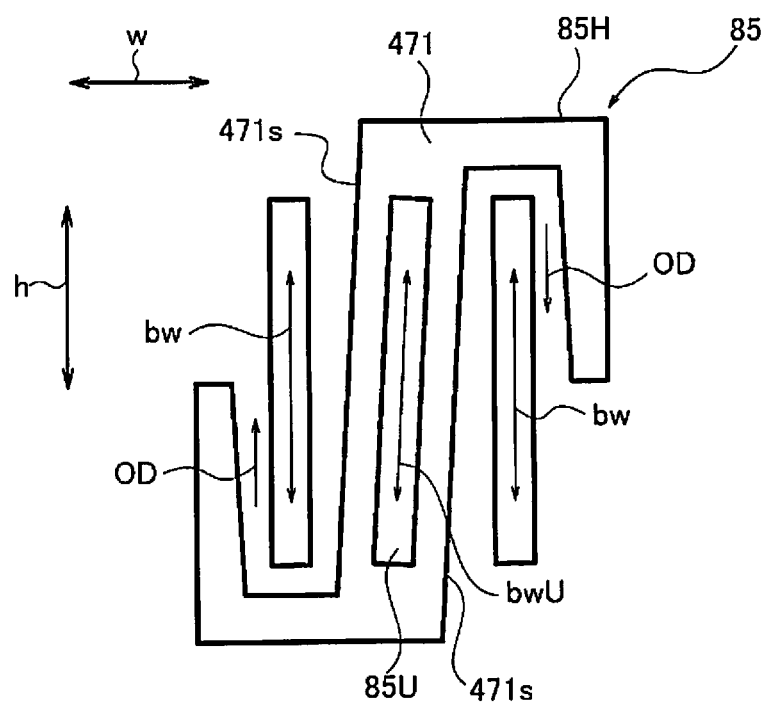
FIG. 14 is a schematic end view illustrating the end surface of a fourth modified example of the bus bar unit.

In the first embodiment, an example was shown in which the width direction bw of the U-phase drive side bus bar 43U is parallel to the height direction h. However, it is not necessary to set the width direction bw of the U-phase drive side bus bar 43U to be parallel to the height direction h. For example, as shown by an insulating holder 85H of a bus bar 85 in FIG. 14 (fourth modified example), the width direction bwU of a U-phase drive side bus bar 85U is inclined with respect to the height direction h. That is, the width direction bwU of the U-phase drive side bus bar 85U can be inclined in the same manner as a mold side surface 471s of a molded portion 471. The effects described in (1) to (5) of the first embodiment can also be obtained by configuring in this manner. Even with the configuration of FIG. 14, the insulating holder 85H holds a plurality of bus bars that are arranged in parallel.

In the first embodiment, an example was shown in which the mold side surfaces 431s, 431s are inclined surfaces that are inclined relative to the height direction h, and the wall side surfaces 432s, 432s are inclined surfaces that are inclined relative to the height direction h. However, it can be configured such that either the mold side surfaces 431s, 431s or the wall side surfaces 432s, 432s are parallel surfaces that are parallel to the height direction h. The effect described in (4) of the first embodiment can be obtained by configuring in this manner.

In the first and second embodiments, examples were shown in which the bus bar unit of the present invention is applied to a bus bar unit of an inverter device of a motor/generator that is mounted on a range extender electric vehicle as a travel drive source, or the like. However, the bus bar unit of the present invention can be applied to a bus bar unit of an inverter device of a series hybrid vehicle, a plug-in hybrid vehicle, or an electric vehicle provided with only a motor as a driving power source. The number of motors mounted on the vehicle can be one, or more than one. In addition, the bus bar unit of the present invention can be applied to a bus bar unit of an inverter device of a vehicle.

The invention claimed is:

1. A bus bar unit comprising:
a plurality of bus bars; and
an insulating holder holding the plurality of bus bars in a parallel arrangement and insulating between the plurality of the bus bars,
the insulating holder including a molded portion molded about an entire periphery of at least one bus bar from among the plurality of bus bars, a wall portion provided at a position spaced apart from a side surface of the molded portion to insulate the plurality of bus bars, and a groove portion holding a remaining bus bar between the molded portion and the wall portion, and
a height of the wall portion being lower than a height defined by a width of the bus bars.

2. The bus bar unit according to claim 1, wherein
the remaining bus bar includes a plurality of the remaining bus bars,
the groove portion includes a first groove portion and a second groove portion, the first and second groove portions having different opening directions, and
the remaining bus bars are respectively held by the first groove portion and the second groove portion.

3. The bus bar unit according to claim 2, wherein
the plurality of bus bars is a total of three,
one of the three of the bus bars is molded in the molded portion about the entire periphery of the bus bar,
the first groove portion and the second groove portion are provided on opposite sides of the molded portion, respectively, and
one of the remaining bus bars is held in the first groove portion and one of the remaining bus bars is held in the second groove portion.

4. The bus bar unit according to claim 1, wherein
the groove portion has an inner surface side width that becomes wider from a groove bottom portion towards a groove opening.

5. The bus bar unit according to claim 1, wherein
the height of the wall portion is set based on an insulation distance required between the remaining bus bar that is held in the groove portion.

6. The bus bar unit according to claim 2, wherein
the groove portion has an inner surface side width that becomes wider from a groove bottom portion towards a groove opening.

7. The bus bar unit according to claim 3, wherein
each of the first and second groove portions has an inner surface side width that becomes wider from a groove bottom portion towards a groove opening.

8. The bus bar unit according to claim 2, wherein
the height of the wall portion is set based on an insulation distance required between the remaining bus bar that is held in the groove portion.

9. The bus bar unit according to claim 3, wherein
the height of the wall portion is set based on an insulation distance required between the remaining bus bars that are held in the first and second groove portions.

10. The bus bar unit according to claim 4, wherein
the height of the wall portion is set based on an insulation distance required between the remaining bus bar that is held in the groove portion.

* * * * *